United States Patent
Cheng

(10) Patent No.: US 7,315,051 B2
(45) Date of Patent: Jan. 1, 2008

(54) METHOD OF FORMING A SOURCE/DRAIN AND A TRANSISTOR EMPLOYING THE SAME

(75) Inventor: Shui-Ming Cheng, Chu-bai (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 295 days.

(21) Appl. No.: 11/059,956

(22) Filed: Feb. 17, 2005

(65) Prior Publication Data

US 2005/0148148 A1 Jul. 7, 2005

Related U.S. Application Data

(62) Division of application No. 10/718,911, filed on Nov. 21, 2003, now Pat. No. 6,872,626.

(51) Int. Cl.
*H01L 31/00* (2006.01)
*H01L 29/739* (2006.01)
*H01L 29/76* (2006.01)
*H01L 29/94* (2006.01)

(52) U.S. Cl. .................... 257/192; 257/197; 257/369; 257/E21.063

(58) Field of Classification Search ............... 257/192, 257/197, 369, E29.162, E29.267, E29.056, 257/E29.316, E29.021, E29.063
See application file for complete search history.

(56) References Cited

U.S. PATENT DOCUMENTS

| | | | |
|---|---|---|---|
| 5,908,313 A | 6/1999 | Chau et al. | |
| 5,972,762 A | 10/1999 | Wu | |
| 6,198,142 B1 | 3/2001 | Chau et al. | |
| 6,274,448 B1 | 8/2001 | Lin et al. | |
| 6,383,883 B1 | 5/2002 | Cheng et al. | |
| 6,482,663 B1 | 11/2002 | Bäcklund | |
| 6,521,949 B2 | 2/2003 | Assaderaghi et al. | |
| 6,627,502 B1 | 9/2003 | Cho | |
| 6,627,543 B1 | 9/2003 | Cao et al. | |
| 6,670,253 B2 | 12/2003 | Lee | |
| 6,703,685 B2 | 3/2004 | Ahmed et al. | |
| 6,724,660 B2 | 4/2004 | Skotnicki et al. | |
| 6,921,913 B2 * | 7/2005 | Yeo et al. ..................... 257/18 |

* cited by examiner

*Primary Examiner*—Walter L Lindsay, Jr.
(74) *Attorney, Agent, or Firm*—Slater & Matsil, L.L.P.

(57) ABSTRACT

A method of forming a source/drain having a reduced junction capacitance and a transistor employing the same. In one embodiment, the method of forming the source/drain includes forming a recess in a substrate adjacent a gate of the transistor and forming a deep doped region below a bottom surface of the recess. The method also includes epitaxially growing a semiconductor material within the recess and forming a lightly doped drain region adjacent the gate.

20 Claims, 16 Drawing Sheets

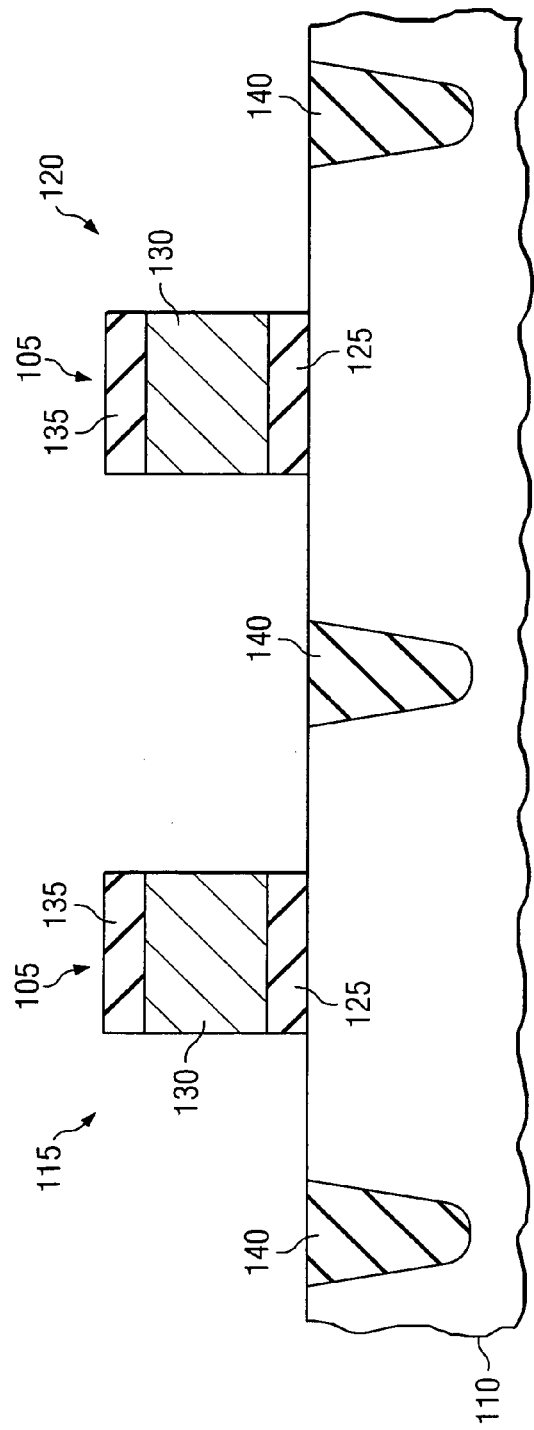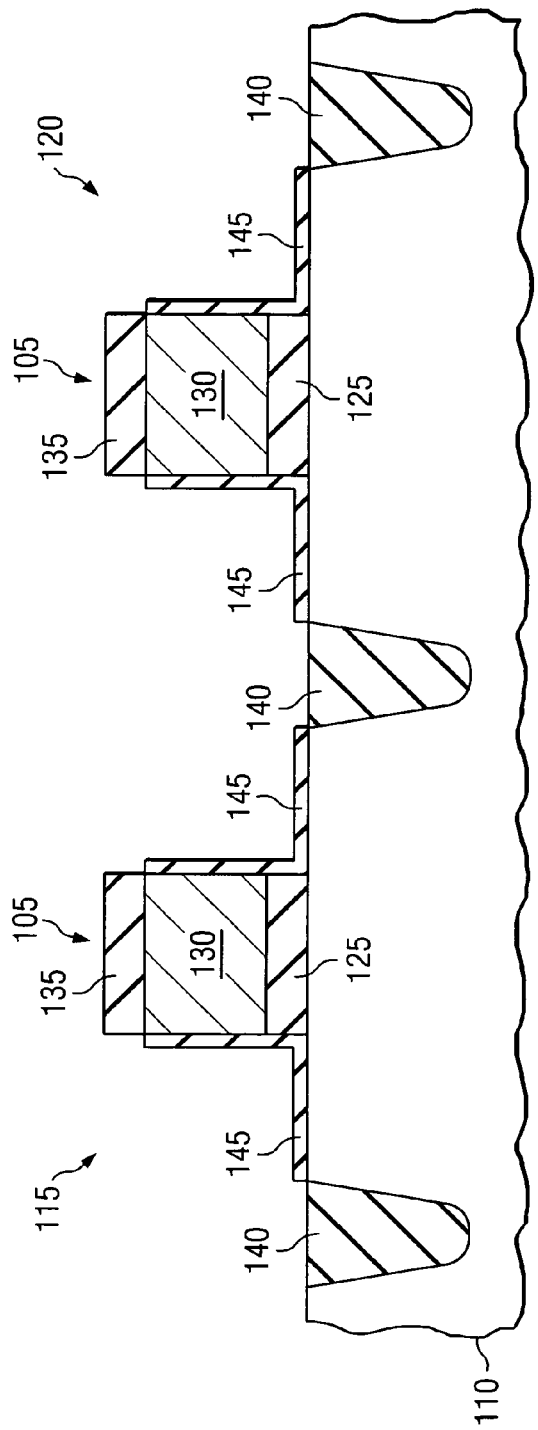

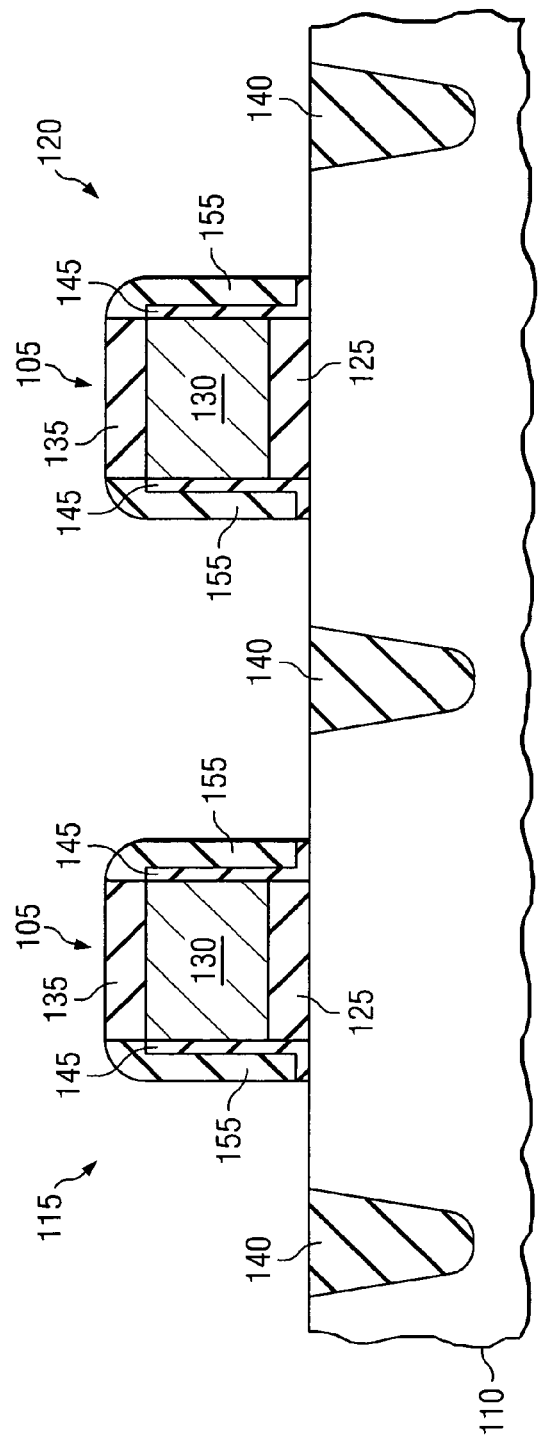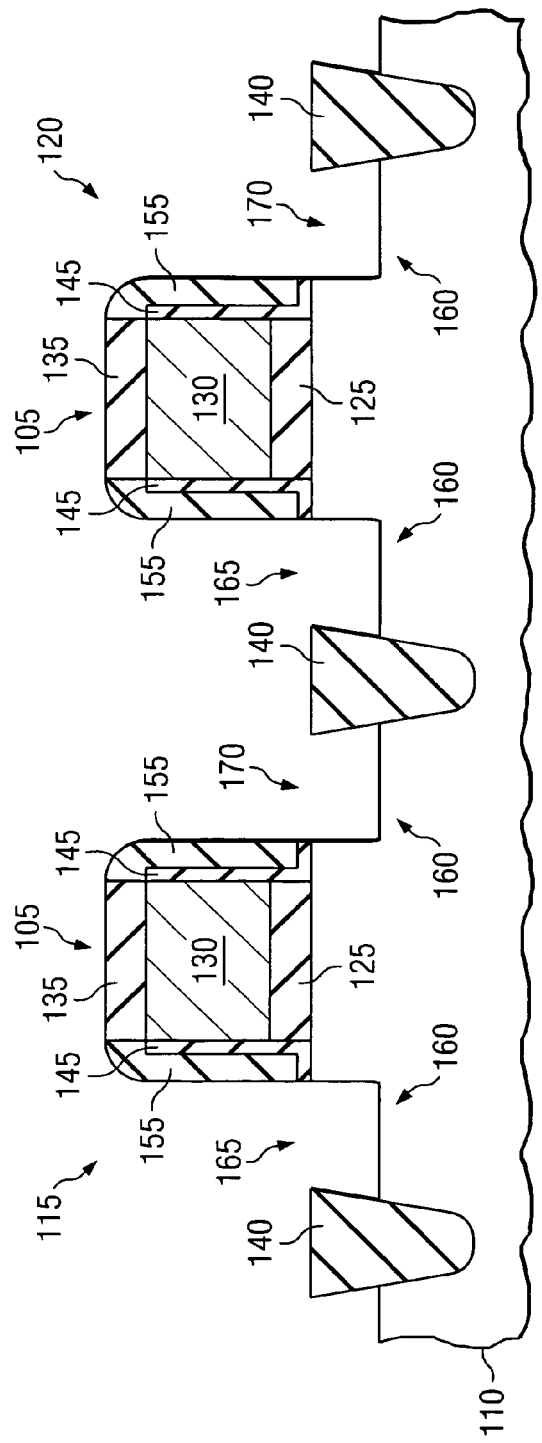

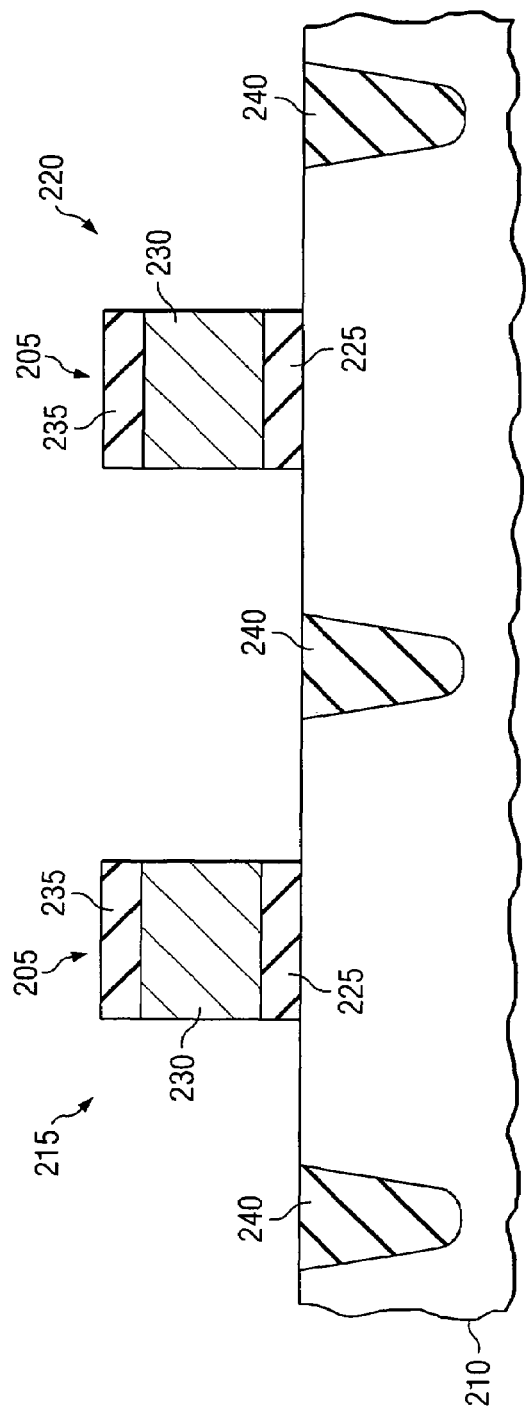
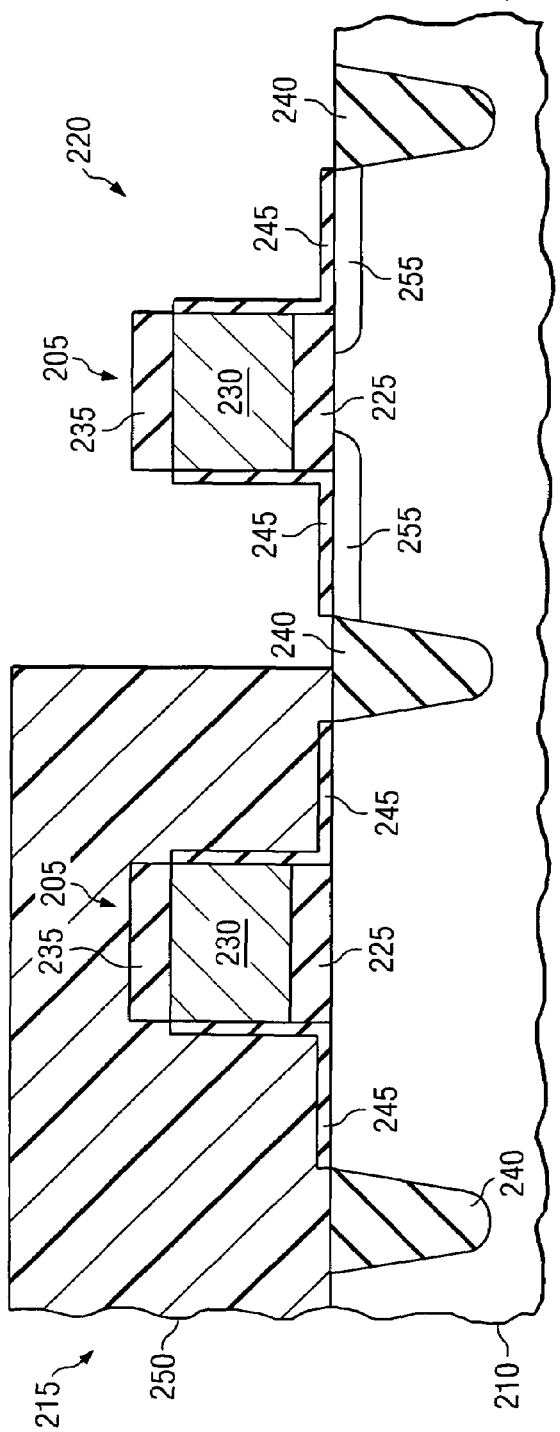

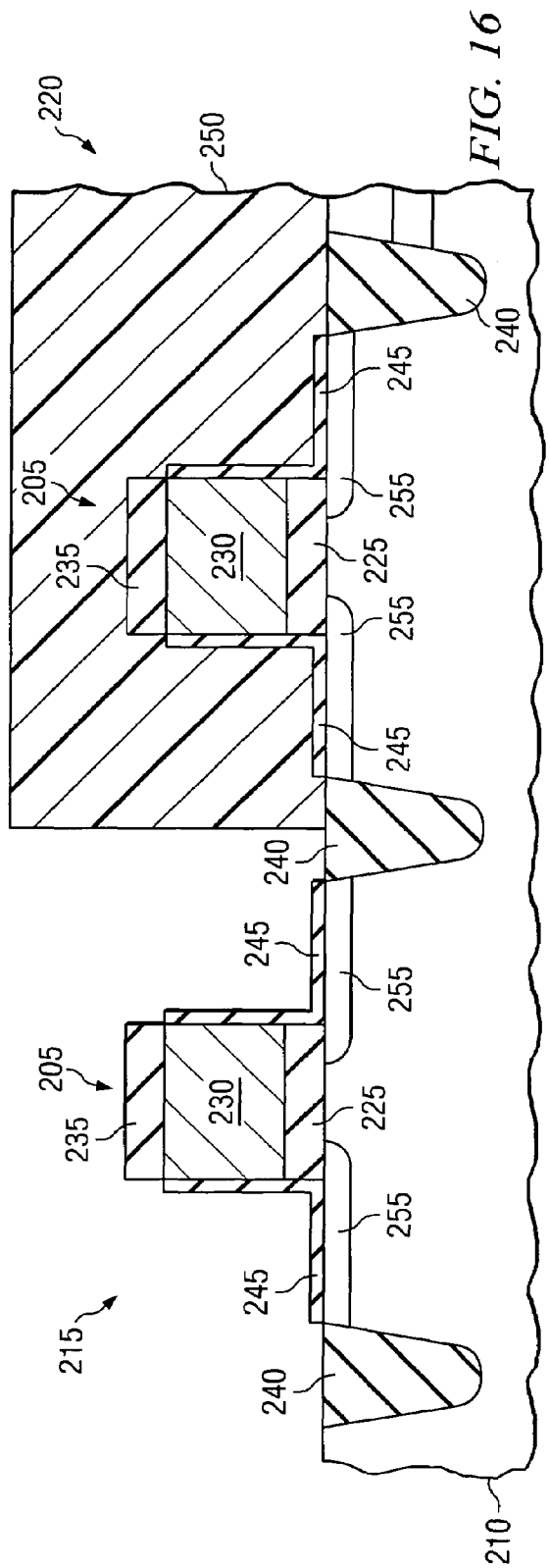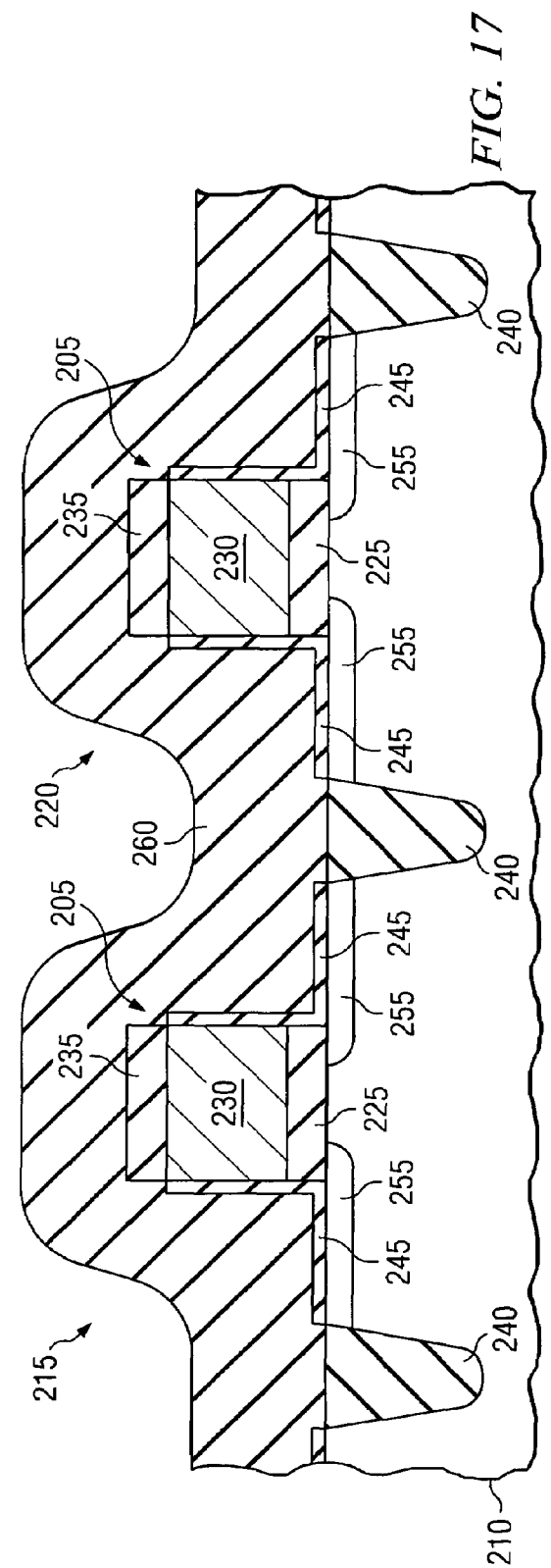

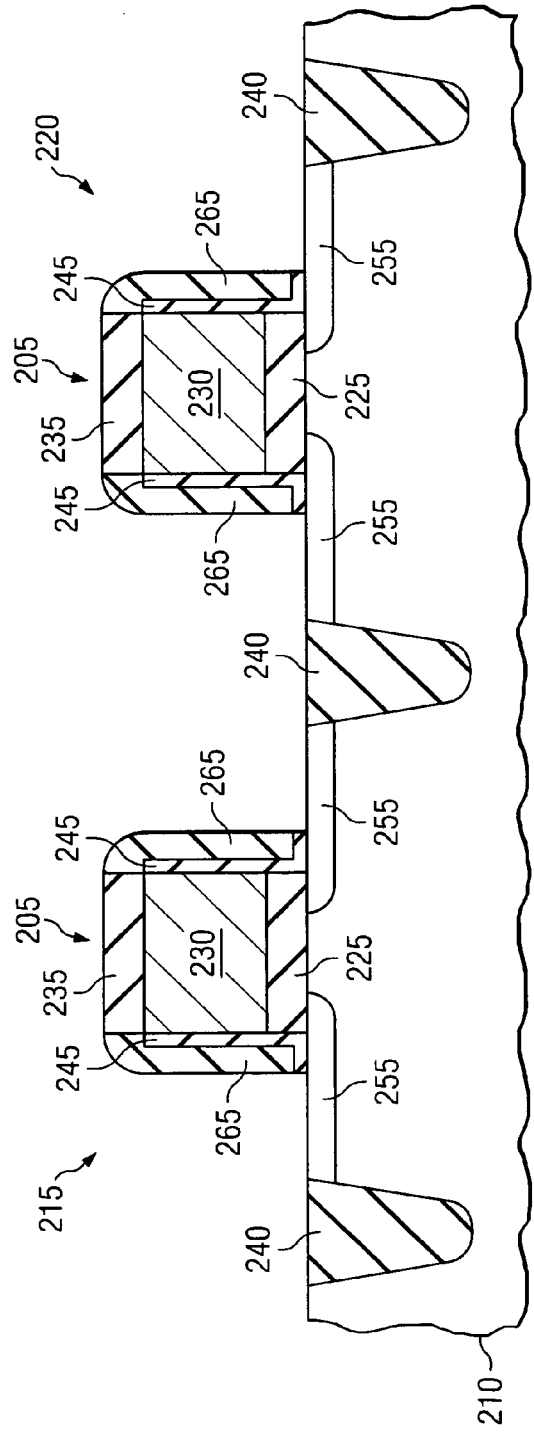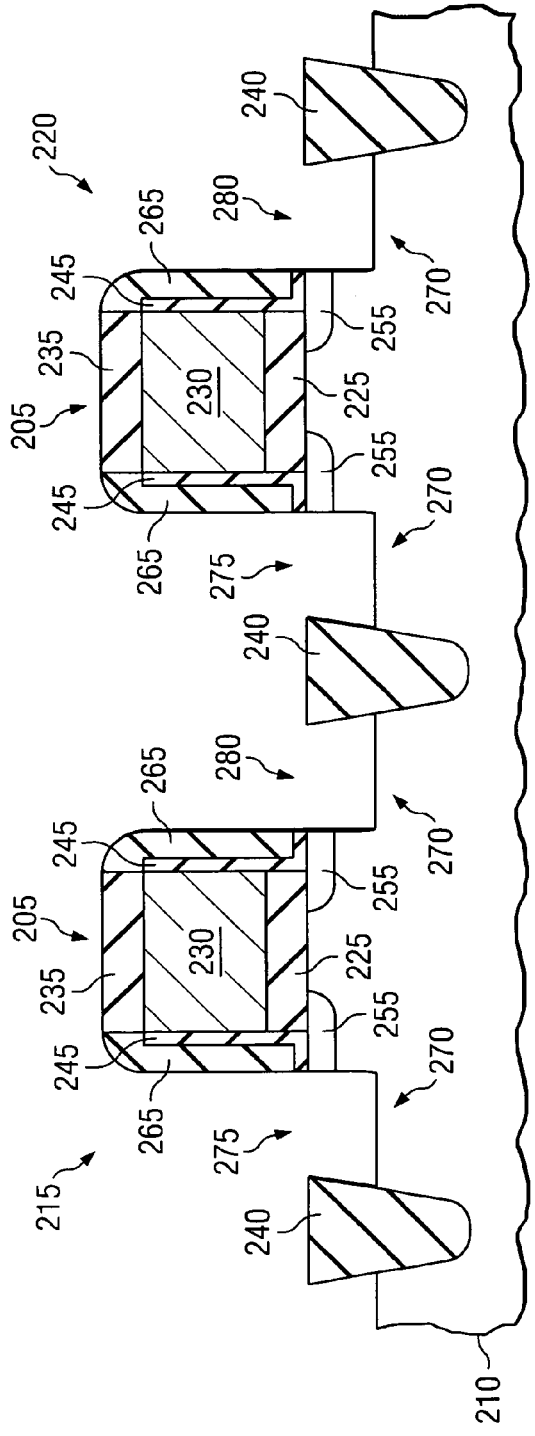

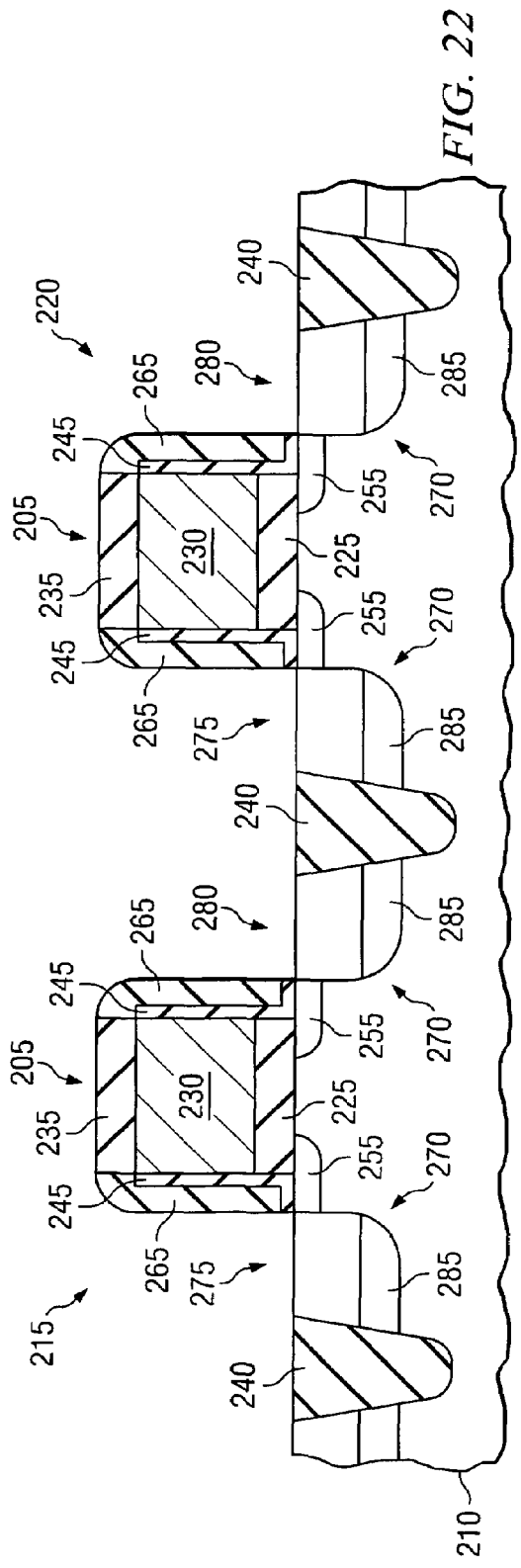
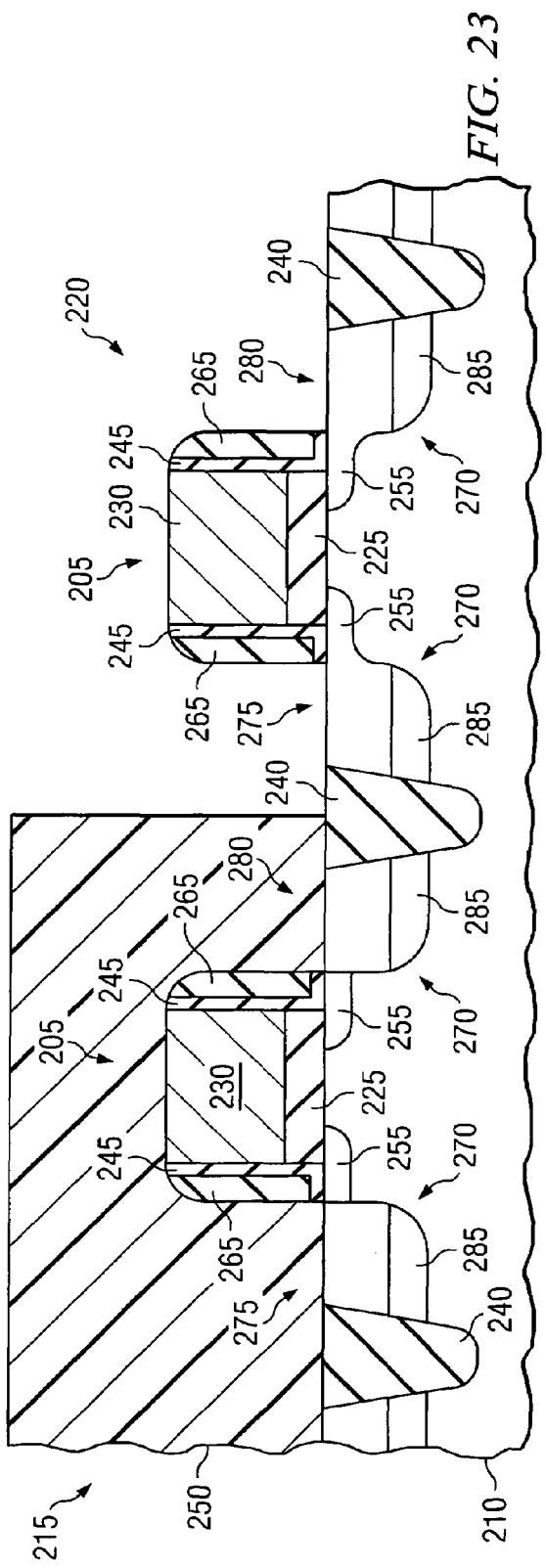

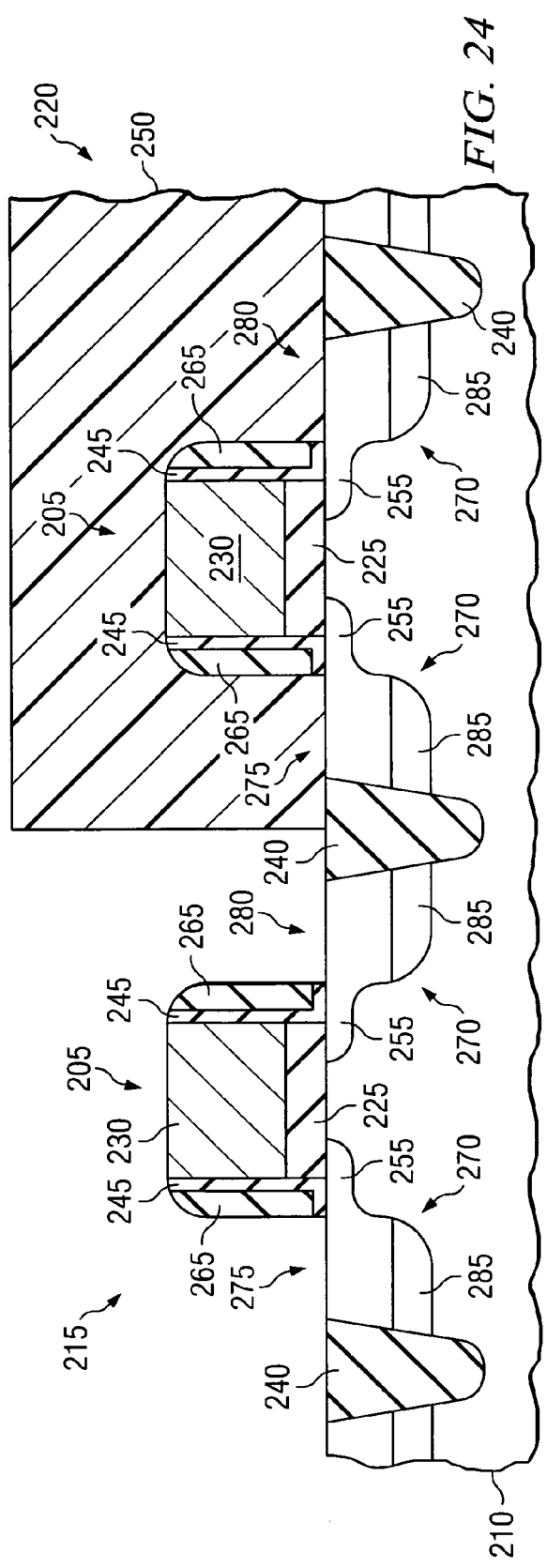
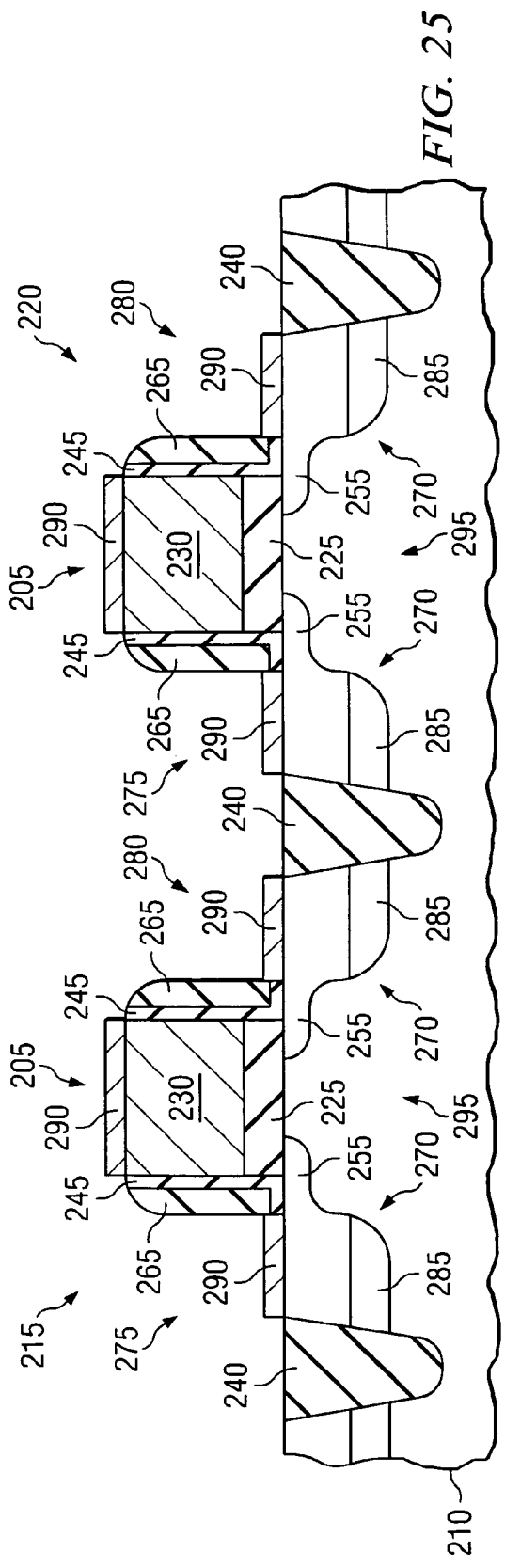

# METHOD OF FORMING A SOURCE/DRAIN AND A TRANSISTOR EMPLOYING THE SAME

This application is a divisional of patent application serial number 10/718,911, entitled "Method of Forming a Source/Drain and a Transistor Employing the Same," filed on Nov. 21, 2003 now U.S. Pat. No. 6,872,626, which application is incorporated herein by reference.

TECHNICAL FIELD

The present invention is directed, in general, to semiconductor devices and, more specifically, to a method of forming a source/drain having a reduced junction capacitance, a related method of forming a transistor, and a transistor employing the same.

BACKGROUND

A transistor is generally formed by a self-aligned polysilicon gate process wherein a source/drain is formed adjacent to a gate by an ion implantation process using the gate as a mask. The source/drain is thereby self-aligned to a gate electrode of the gate. A channel region directly under the gate is also defined by the gate electrode. In order to reduce hot electron injection into the channel region, a source/drain dopant is implanted into a recess adjacent the gate. This lightly doped region is commonly referred to as a lightly doped drain region. The gate serves as a mask for the implant and the source/drain dopant tends to diffuse under a portion of the gate during subsequent thermal processing thereof. Thus, the lightly doped drain region is located adjacent and underlies a portion of the gate. Thereafter, spacers are formed alongside the gate electrode and another source/drain dopant is implanted to form the source/drain. The main section of the source/drain is laterally spaced away from an edge of the gate by the spacer thickness. The source/drain, therefore, consists of a main doped portion to which an external contact is made and the lightly doped drain region adjacent the channel region.

In accordance with a trend toward higher packaging density, transistor features are becoming increasingly smaller resulting in a shorter channel region. A shorter channel region, however, can lead to short channel effects that affect the device performance. In conventional lightly doped drain processes, short channel effects are compensated by implanting shallower junctions which come at the expense of high impurity concentrations. As a consequence, the resultant lower impurity concentrations cause undesirably high source and drain series resistance. There have been several attempts in the past to form improved shallow, lightly doped drain regions. For instance, U.S. Pat. No. 6,627,502 entitled "Method for Forming High Concentration Shallow Junctions for Short Channel MOSFETs," issued Sep. 30, 2003, to Cho, which is commonly assigned with the present invention and incorporated herein by reference, provides a lightly doped drain region by forming shallow lightly doped drain diffusions using polysilicon sidewalls as a diffusion source. Cho and many others continue to investigate processes that provide improved shallow, lightly doped drain regions.

Additionally, as the source/drain is formed in contact with a substrate, a P-N junction is formed within the transistor. At the P-N junction, holes from P-side diffuse into the N-side, while electrons from N-side diffuse into the P-side. As a consequence, an internal field is built, and an electrically neutral depletion region is formed therebetween. The depletion region plays a role as a dielectric layer between the gate and source/drain electrodes which causes a junction capacitance.

A magnitude of the junction capacitance depends on a width of the depletion regions, and the width of depletion regions is related to a junction profile of the implanted ions in the substrate. Because of an abrupt junction profile of arsenic ions, for instance, the width of the depletion region is narrow, and the junction capacitance may become large. Additionally, the high energy implanted arsenic ions create defects in the silicon crystal structure of the substrate, which can lead to leakage in the source/drain.

Analogous to the continuous efforts to develop new processes for the lightly doped drain regions, there have been attempts in the past to reduce junction capacitance associated with the gate and source/drain electrodes of the transistor. For instance, U.S. Pat. No. 6,274,448 entitled "Method of suppressing junction capacitance of source/drain regions," issued Aug. 14, 2001 to Lin, et al, which is incorporated by reference, discloses a method of suppressing junction capacitance associated with a transistor. The source/drains are formed by double implantation of phosphorus ions and arsenic ions. The phosphorus ion implantation lowers an energy needed in the implantation of arsenic ions and reduces dislocations in the source/drains formed during the implantation of the arsenic ions. Further, the double implantation suppresses a junction profile of the arsenic ions and enhances the width of depletion regions. As a result, the junction capacitance is reduced, thereby accelerating a function of the transistor. (Abstract of Lin, et al.). While Lin, et al. provides a solution to lowering a junction capacitance associated with a transistor, there is still a need in the art to provide other processes and structures that reduce a junction capacitance thereof.

Accordingly, what is needed in the art is a transistor and related process of forming the transistor that overcomes short channel effects while at the same time reducing a junction capacitance thereof that improves upon or resolves the deficiencies in the prior art.

SUMMARY OF THE INVENTION

These and other problems are generally solved or circumvented, and technical advantages are generally achieved, by advantageous embodiments of the present invention which includes a method of forming a source/drain and a transistor employing the same. In one embodiment, the method of forming the source/drain includes forming a recess in a substrate adjacent a gate of the transistor and forming a deep doped region below a bottom surface of the recess. The method also includes epitaxially growing a semiconductor material within the recess and forming a lightly doped drain region adjacent the gate.

In another aspect, the present invention provides a transistor and a method of forming the transistor. In one embodiment, the transistor includes a gate formed on a substrate having a gate dielectric and a gate electrode formed thereon. The transistor also includes a source and a drain, each formed in a recess of the substrate adjacent opposite sides of the gate. The source and drain each include a lightly doped drain region adjacent the gate and a deep doped region below a bottom surface of the recess.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 to 13 illustrate cross sectional views of an embodiment of constructing a transistor according to the principles of the present invention; and FIGS. 14 to 25 illustrate cross sectional views of another embodiment of constructing a transistor according to the principles of the present invention.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 3:
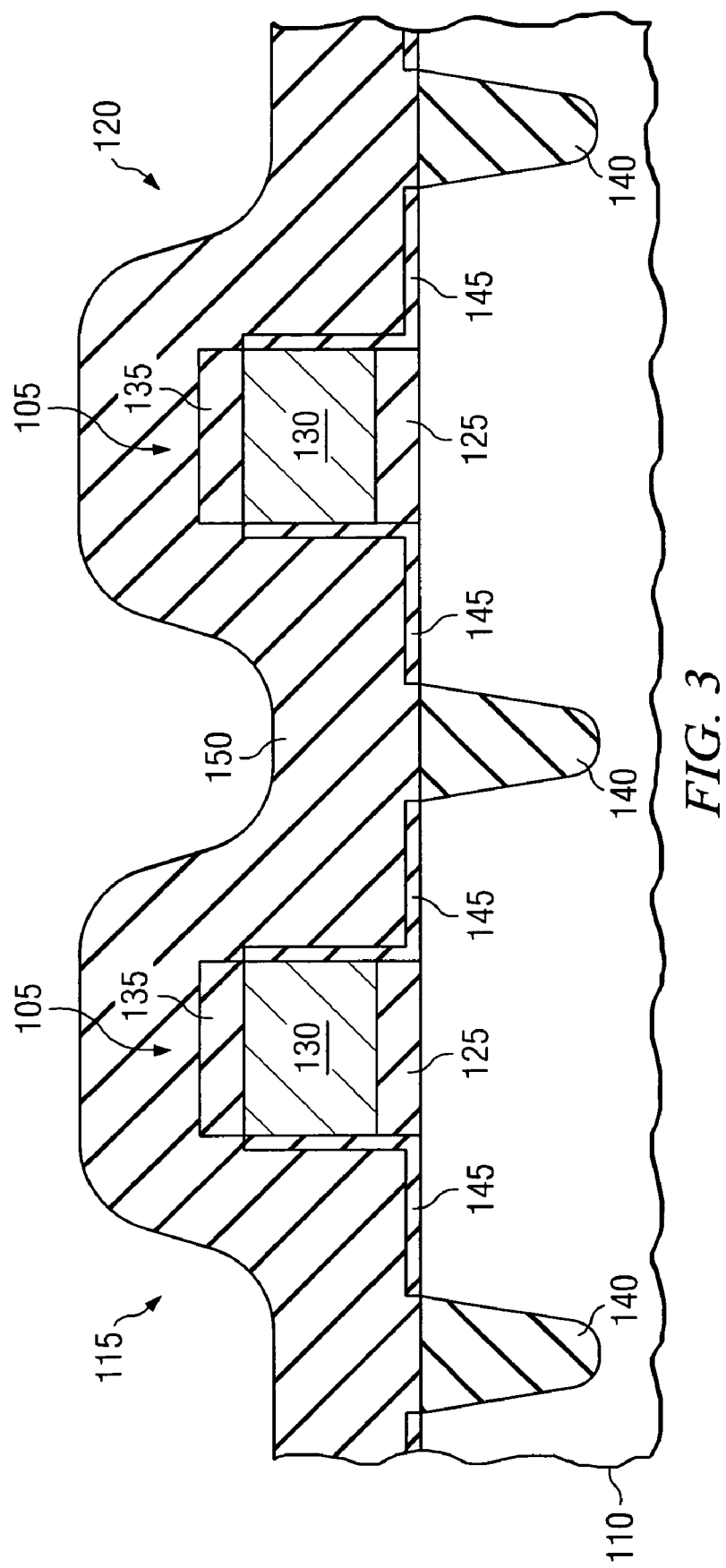

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a method of forming a transistor and a transistor employing the same. The principles of the present invention, however, may also be applied to other semiconductor devices of like construction. The advantages associated with the method and resulting transistor further exploit the benefits associated with the application of low junction transistors in electronic devices.

Referring to FIGS. 1-13, illustrated are cross sectional views of an embodiment of constructing a transistor according to the principles of the present invention. Beginning with FIG. 1, a gate 105 is formed over a substrate 110 (e.g., composed of silicon or silicon-germanium) employing conventional semiconductor processes. The substrate 110 may be a semiconductor layer formed over a buried oxide layer using silicon-on-insulator technology. In the present embodiment, a process of constructing a first transistor 115 (e.g., a P-type metal oxide semiconductor) and a second transistor 120 (e.g., a N-type metal oxide semiconductor) are illustrated and described. Of course, the processes described herein are equally applicable to other types of transistors as well. In the interim processing step illustrated in FIG. 1, the first transistor 115 includes a gate 105 having a gate dielectric 125, a gate electrode 130, and a hard mask 135 on a top surface thereof. Similarly, the second transistor 120 includes a gate 105 having a gate dielectric 125, a gate electrode 130, and a hard mask 135 on a top surface thereof.

In the illustrated embodiment, the first and second transistors 115, 120 are self-aligned transistors and are shown at a point in the process wherein the gates 105 have been patterned by, for instance, anisotropic dry etching. The dry etching may be either reactive ion etching or plasma etching, which are well known and widely accepted practices by those skilled in the art. The substrate 110 includes shallow trench isolation regions 140 formed by conventional processes. Those skilled in the art understand that isolation regions may be formed using conventional methods such as a local oxidation of silicon process.

As mentioned above, the gates 105 of the first and second transistors 115, 120 include the gate dielectric 125 which may be composed of a gate oxide layer (e.g., a thermally grown oxide or nitrided oxide) or a layer of high "k" dielectric material. While the gate electrode 130 of the first and second transistors 115, 120 is composed of a polysilicon layer, those skilled in the art recognize that other materials such as metals (e.g., tungsten, tantalum, aluminum, nickel, ruthenium, rhodium, palladium, platinum, titanium, or molybdenum) and metal compounds (e.g., titanium nitride and tantalum nitride) may also be employed to advantage. The hard mask 135 of the first and second transistors 115, 120 is typically formed from a silicon oxide cap, a silicon nitride cap or a combination thereof.

The layers that form the gate electrode 130 and hard mask 135 are typically blanket deposited by a chemical vapor deposition process. The processes for forming the gates 105 of the first and second transistors 115, 120 are well known to those skilled in the art. In an exemplary embodiment, the gate dielectric 125 may be about 0.5 to 8 nanometers (nm) thick and the gate electrode 130 may be about 50 to 150 nm thick. The gate electrode 130 may consist of a single uniformly doped polysilicon layer or it may have an upper heavily doped portion and a lower undoped portion. The hard mask 135 may be about 10 to 100 nm thick.

Turning now to FIG. 2, the first and second transistors 115, 120 are placed in an oxidizing environment and exposed regions of silicon including the substrate 110 and polysilicon layers of the gates 105 are oxidized or deposited to form an oxide layer 145 about the first and second transistors 115, 120. The shallow trench regions 140 and the hard mask 135 (if formed by an oxide material) may also have an oxide layer formed on exposed surfaces thereof. For purposes of clarity, however, an oxide layer is not illustrated on the shallow trench regions 140 and the hard mask 135 of the first and second transistors 115, 120.

Turning now to FIGS. 3 and 4, an insulating layer 150 (e.g., a silicon nitride, silicon oxide or a combination thereof) is blanket deposited over the substrate 110 and first and second transistors 115, 120 using, for instance, a chemical vapor deposition or a plasma enhanced chemical vapor deposition. Thereafter, temporary spacers 155 are formed about the gates 105 of the first and second transistors 115, 120 by plasma dry etching the insulating layer until the planar portions of the substrate 110 and hard mask 135 of the gates 105 of the first and second transistors 115, 120 are reached. As depicted in FIG. 4, the temporary spacers 155 are highly tapered toward the hard mask 135 of the gates 105 of the first and second transistors 115, 120 and, typically, range from 5 to 100 nm wide.

Turning now to FIG. 5, lateral recesses (hereinafter referred to as "recesses") 160 in which will be formed a source 165 and drain 170 of the first and second transistors 115, 120 are formed by etching the substrate 110 adjacent the gates 105 thereof. The recesses 160 are self-aligned with the temporary spacers 155 about the gates 105 of the first and second transistors 115, 120. As well understood by those skilled in the art, etching the substrate 110 may be accomplished by many processes such as a chemical dry etching process.

The dimensions and depth of the recesses 160 are a function of the desired features and characteristics of the first and second transistors 115, 120. As an example, if one of the first and second transistors 115, 120 is a logic device, then a gate length may equal 5 to 20 nm, 20 to 40 nm, and 40 to 60 nm, depending on a technology node employed, and a depth of the recesses 160 may be in the range of 5 to 20 nm, 20 to 50 nm and 50 to 100 nm, depending on a technology node employed and, preferably, a depth of 20 to 50 nm, for a 65 nm technology node. Although the recesses 160 for the source 165 and drain 170 of the first and second transistors 115, 120 are illustrated as symmetrical, those skilled in the art recognize that the recess 160 for the source 165 may have different dimensions (e.g., be shallower or deeper) than the recess 160 for the drain 170 and vice versa.

Figure 6:
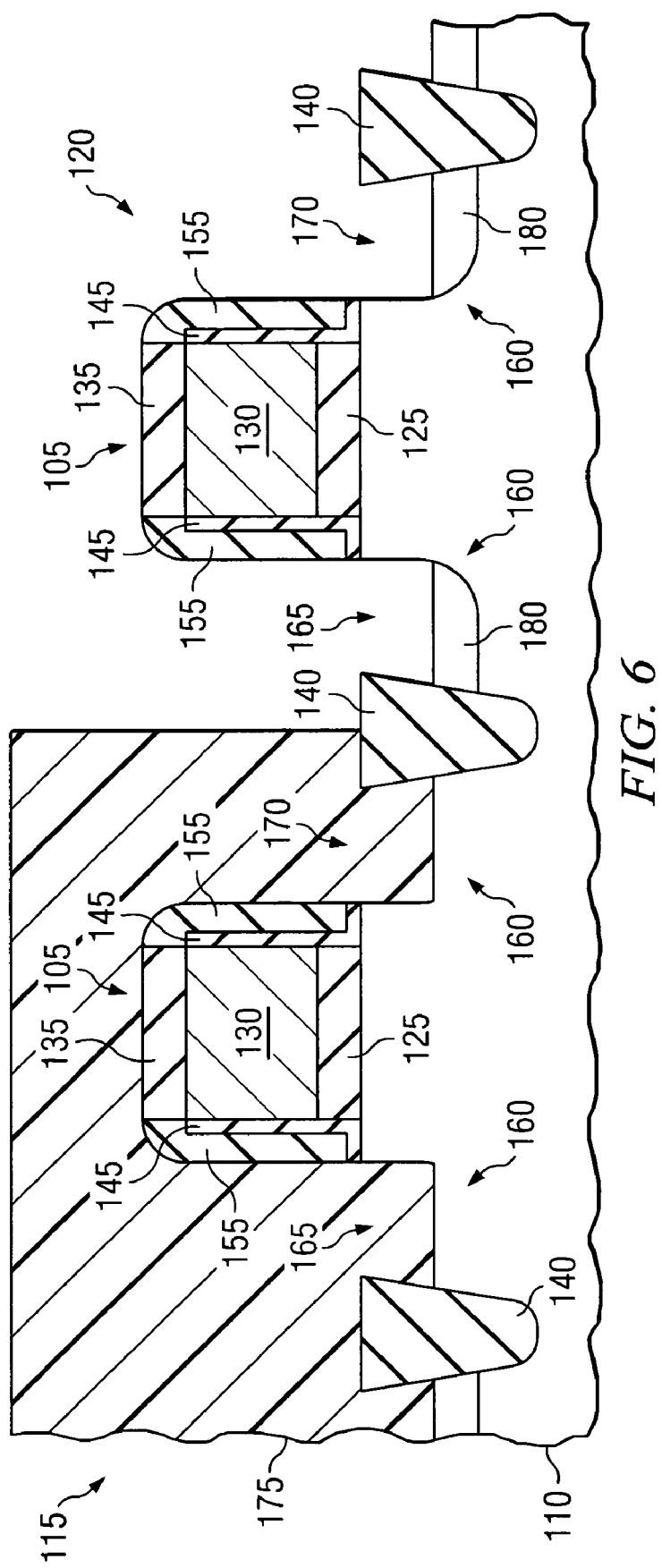

Turning now to FIG. 6, a region of the first transistor 115 is protected by a photo resist layer 175 and an ion implantation process is performed to form a deep doped region 180 below a bottom surface of the recesses 160 for the source 165 and drain 170 of the second transistor 120. Typically, to form the deep doped regions 180 in the second transistor 120 (a N-type metal oxide semiconductor), arsenic ions are implanted into the substrate 110 and the gate 105 and temporary spacers 155 serve as a mask. Of course, other N-type dopants such as antimony and phosphorous may also be employed to form the deep doped region 180. The ion implantation process of arsenic may be performed at an energy level of about 5 to 15 keV and at a dose of $5 \times 10^{12}$ to $1 \times 10^{14}$ atoms/cm$^2$. The photo resist layer 175 that protects a region of the first transistor 115 is thereafter removed by, for instance, ashing or the like as well understood by those skilled in the art.

Figure 7:
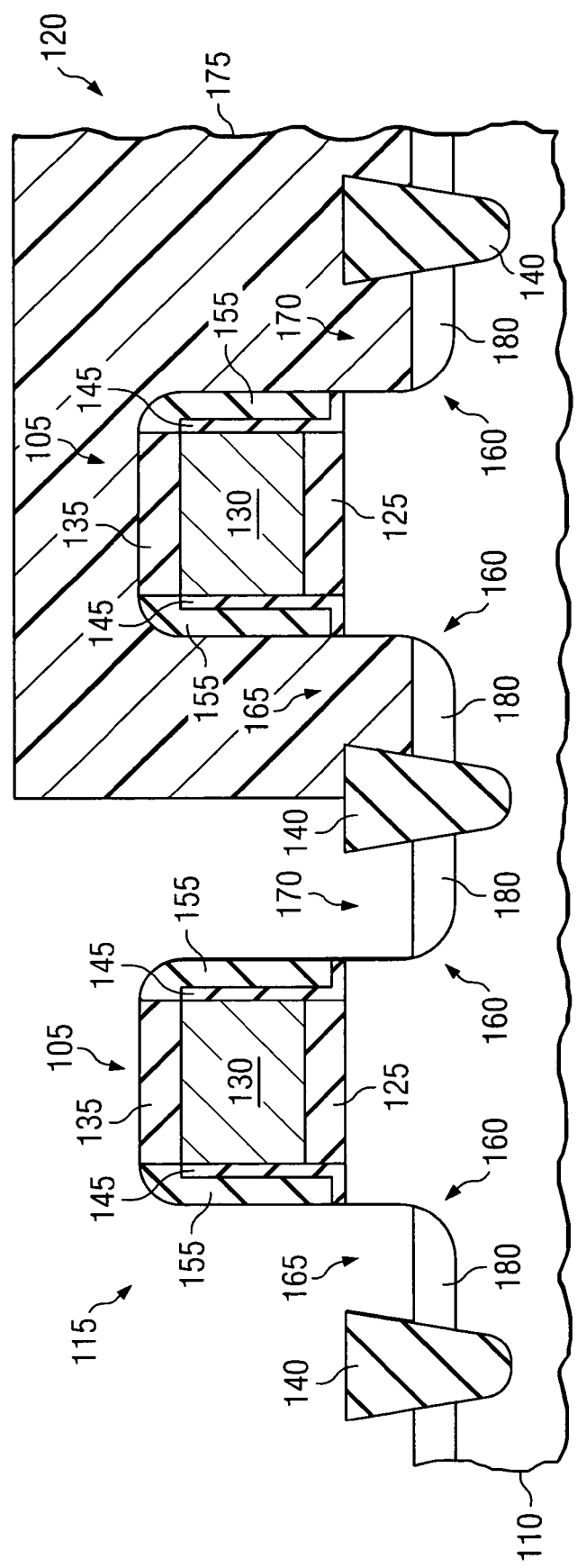

Turning now to FIG. 7, a region of the second transistor 120 is then protected by a photo resist layer 175 and an ion implantation process is performed to form a deep doped region 180 below a bottom surface of the recesses 160 for the source 165 and drain 170 of the first transistor 115. Typically, to form the deep doped regions 180 in the first transistor 115 (a P-type metal oxide semiconductor), boron ions are implanted into the substrate 110 and the gate 105 and temporary spacers 155 serve as a mask. Of course, other P-type dopants such as boron difluoride may also be employed to form the deep doped region 180. The ion implantation process of boron may be performed at an energy level of about 0.5 to 10 keV and at a dose of $5 \times 10^{12}$ to $1 \times 10^{14}$ atoms/cm$^2$. Again, the photo resist layer 175 that protects the region of the second transistor 120 is thereafter removed by, for instance, ashing or the like as well understood by those skilled in the art.

Figure 8:
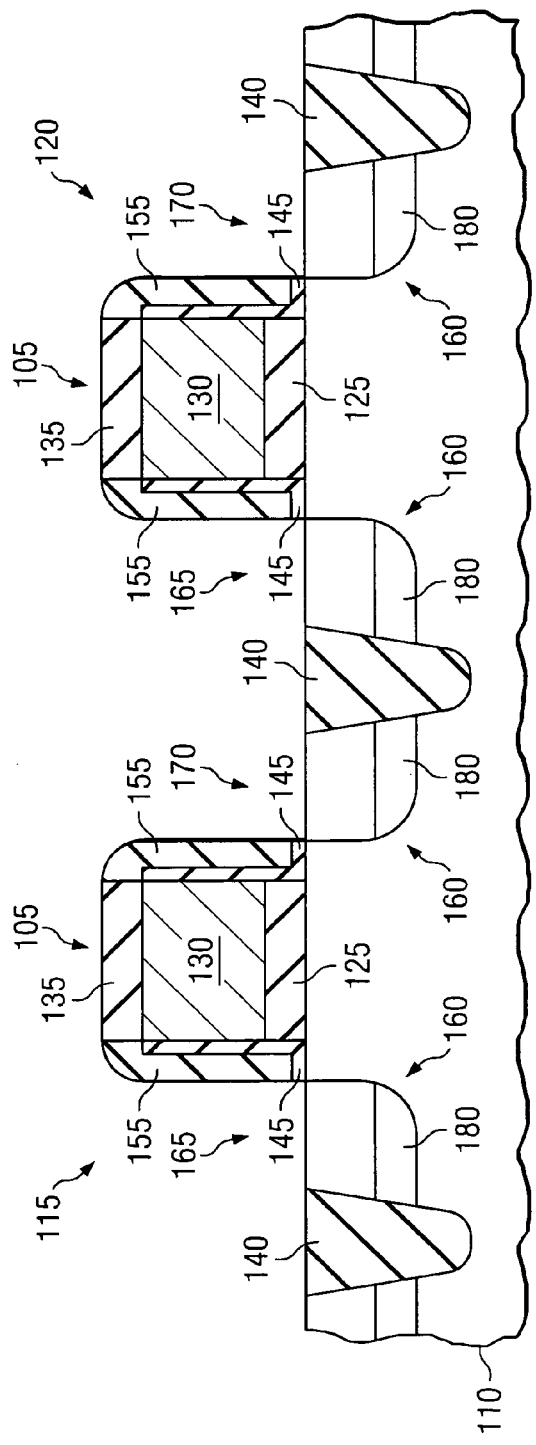

Turning now to FIG. 8, a selective epitaxial growth process such as a molecular beam epitaxial growth process is performed to deposit, for instance, silicon, silicon germanium or silicon carbon at a thickness of 30 to 50 nm, 50 to 100 nm, or 100 to 150 nm within the recesses 160 for the source 165 and drain 170 of the first and second transistors 115, 120. Alternatively, the source 165 and drain 170 of the first and second transistors 115, 120 may be formed by performing a selective ultra high vacuum chemical vapor deposition or atomic layer deposition of the silicon, silicon germanium or silicon carbon. Thereafter, the temporary spacers 155 and the hard mask 135 about the gates 105 of the first and second transistors 115, 120 are removed.

Figure 9:
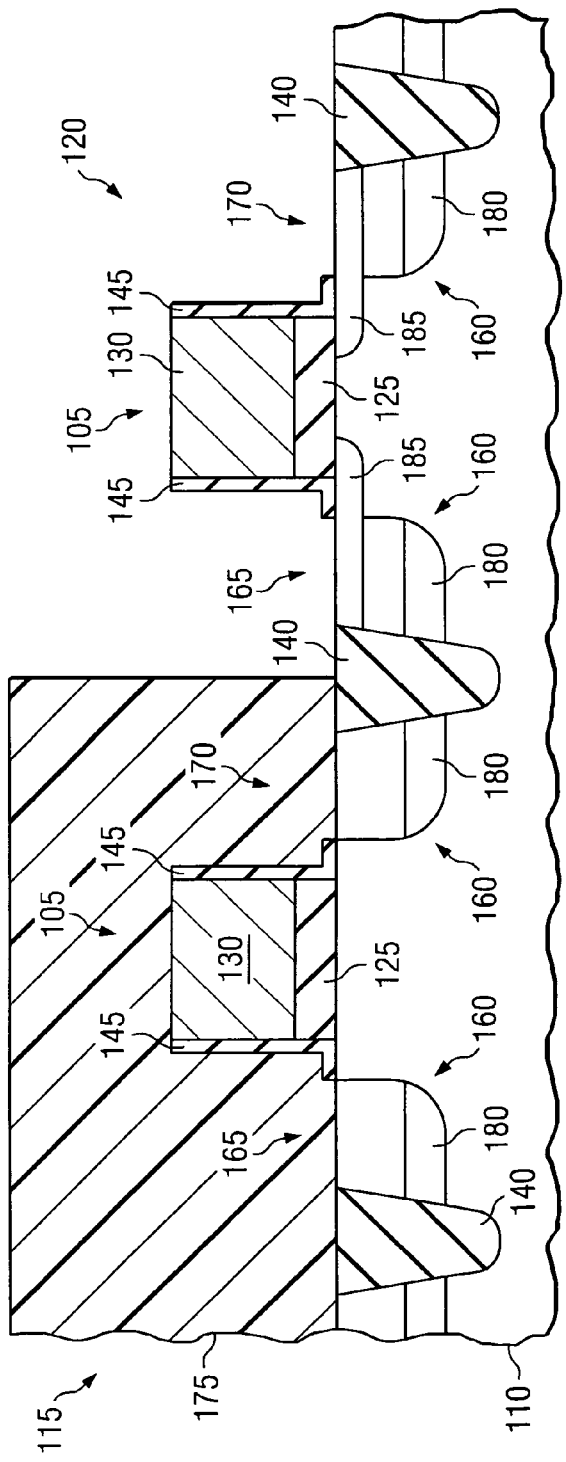

Turning now to FIG. 9, the region of the first transistor 115 is then protected by a photo resist layer 175 and an ion implantation process is performed to form a lightly doped drain region 185 adjacent and slightly under the gate 105 of the second transistor 120. Typically, to form the lightly doped drain regions 185 of the second transistor 120 (a N-type metal oxide semiconductor), arsenic ions are implanted into the substrate 110 and the gate 105 serves as a mask. Of course, other N-type dopants such as antimony and phosphorous may also be employed to form the lightly doped drain regions 185 for the second transistor 120. The ion implantation process of arsenic may be performed at an energy level of about 0.5 to 5 keV and at a dose of $5 \times 10^{14}$ to $2 \times 10^{15}$ atoms/cm$^2$.

Since the temporary spacers 155 about the gate 105 of the second transistor 120 have been removed, the lightly doped drain regions 185 thereof are not spaced apart from, but in fact align with, the edges of the gate 105. In fact, the lightly doped drain regions 185 underlie a portion of the gate 105 of the second transistor 120. As clearly understood by those skilled in the art, the arsenic ions diffuse under the gate 105 during subsequent thermal processing. The out-diffusion, as it is referred to, is desirable to achieve a shorter effective channel length under the gate 105 of the second transistor 120. Again, the photo resist layer 175 that protects region of the first transistor 115 is thereafter removed by, for instance, ashing or the like as well understood by those skilled in the art.

Figure 10:
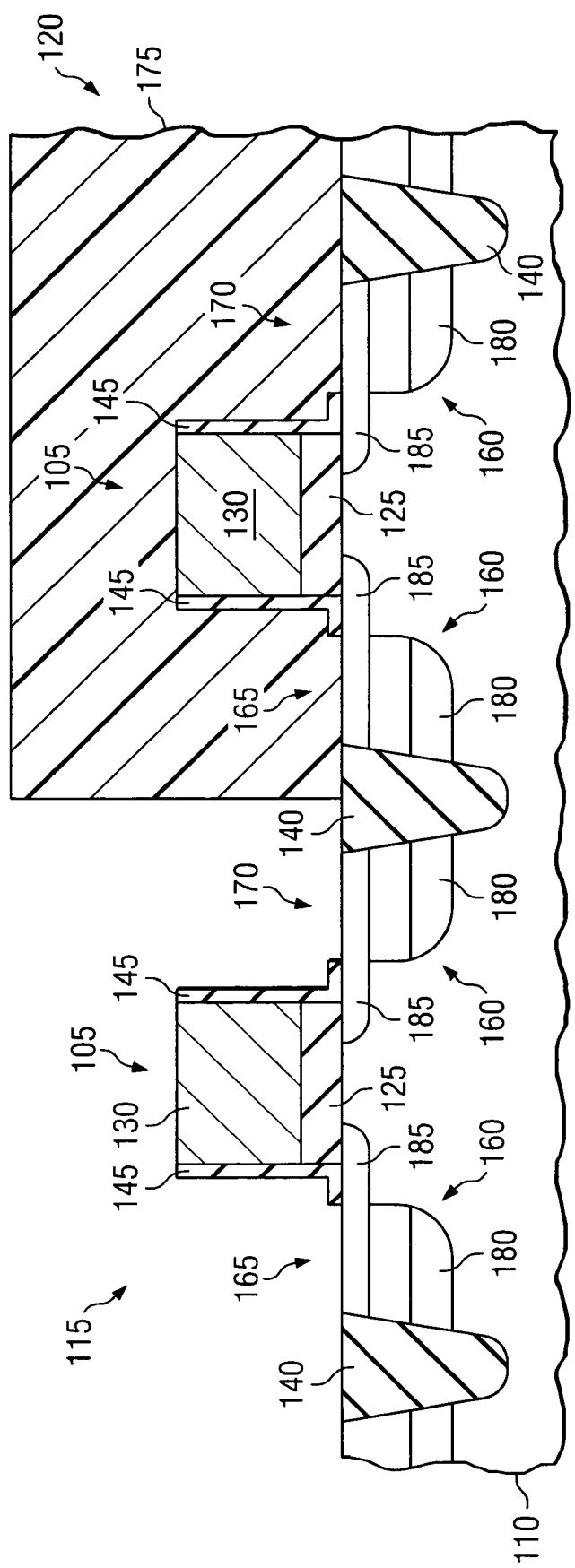

Turning now to FIG. 10, the region of the second transistor 120 is then protected by a photo resist layer 175 and an ion implantation process is performed to form a lightly doped drain region 185 adjacent and slightly under the gate 105 of the first transistor 115. Typically, to form the lightly doped drain regions 185 of the first transistor 115 (a P-type metal oxide semiconductor), boron ions are implanted into the substrate 110 and the gate 105 serves as a mask. Of course, other P-type dopants such as boron difluoride may also be employed to form the lightly doped drain regions 185 for the first transistor 115. The ion implantation process of boron may be performed at an energy level of about 0.5 to 5 keV and at a dose of $5 \times 10^{14}$ to $2 \times 10^{15}$ atoms/cm$^2$.

Analogous to discussion above, since the temporary spacers 155 about the gate 105 of the first transistor 115 have been removed, the lightly doped drain regions 185 thereof are not spaced apart from, but in fact align with, the edges of the gate 105. In fact, the lightly doped drain regions 185 underlie a portion of the gate 105 of the first transistor 115. As clearly understood by those skilled in the art, the boron ions diffuse under the gate 105 during subsequent thermal processing. The out-diffusion is desirable to achieve a shorter effective channel length under the gate 105 of the first transistor 115. Again, the photo resist layer 175 that protects the region of the second transistor 120 is thereafter removed by, for instance, ashing or the like as well understood by those skilled in the art.

Figure 11:
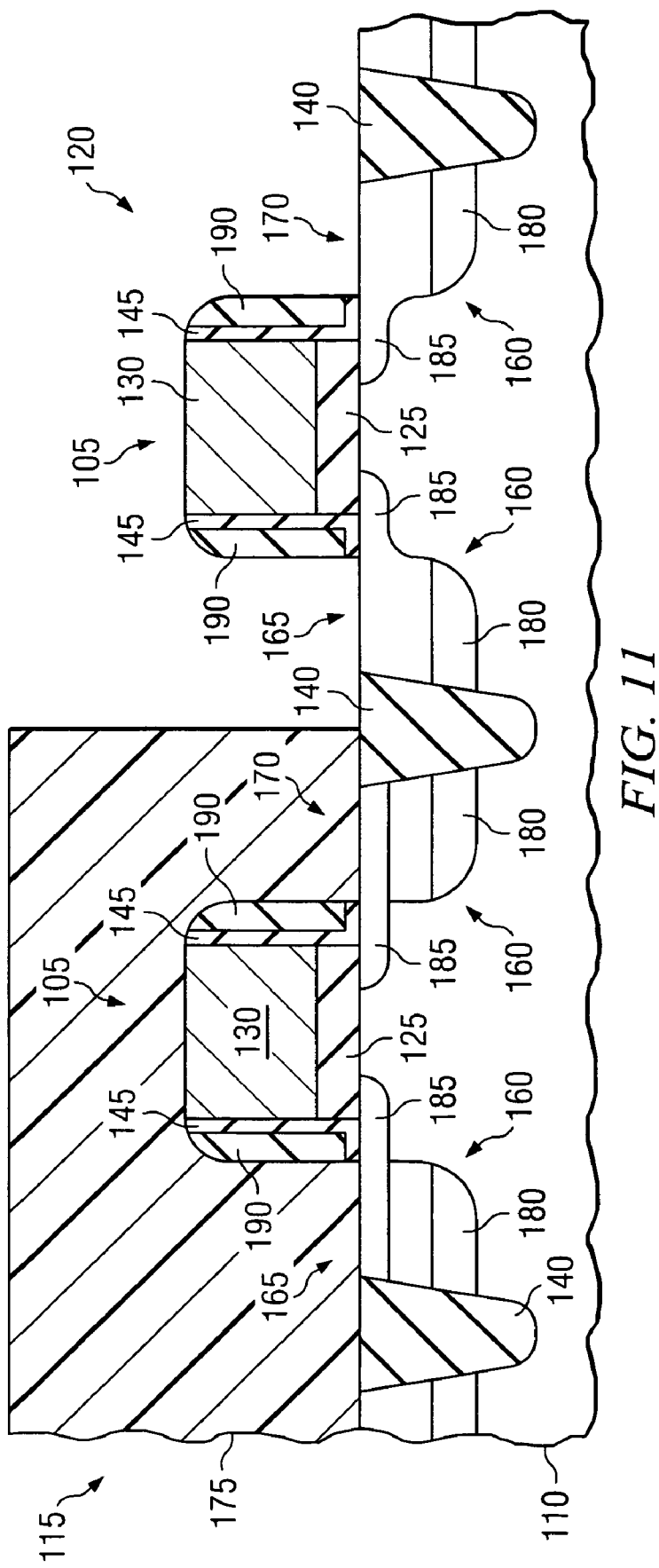

Turning now to FIG. 11, analogous to constructing the temporary spacers 155 as described above, an insulating layer (e.g., a silicon nitride, silicon oxide or a combination thereof) is blanket deposited over the substrate 110 and first and second transistors 115, 120. Thereafter, spacers 190 are formed about the gates 105 of the first and second transistors 115, 120 by plasma dry etching the insulating layer until the planar portions of the substrate 110 and a top surface of the gate 105 of the first and second transistors 115, 120 are reached. As depicted in FIG. 11, the spacers 190 are highly tapered toward a top surface of the gate electrodes 130 of the first and second transistors 115, 120 and, typically, range from 10 to 20 nm, 20 to 40 nm, 40 to 60 nm, or 60 to 100 nm wide, depending on a technology node employed.

The region of the first transistor 115 is then protected by a photo resist layer 175 and an ion implantation process is performed to dope the epitaxial grown source 165 and drain 170 of the second transistor 120. Typically, to dope the source 165 and drain 170 of the second transistor 120 (a N-type metal oxide semiconductor), arsenic ions are implanted into the substrate 110 and the gate 105 and spacers 190 serve as a mask. Of course, other N-type dopants such as antimony and phosphorous may also be introduced to dope the source 165 and drain 170 of the second transistor 120. The ion implantation process of arsenic may be performed at an energy level of about 10 to 30 keV and at a dose of $5\times10^{12}$ to $5\times10^{15}$ atoms/cm$^2$. While an ion implantation process has been described to dope the epitaxial gown source 165 and drain 170, those skilled in the art will recognize that other processes such as an in situ doped epitaxial growth process may be employed to introduce N-type dopants into the source 165 and drain 170 of the second transistor 120 during the epitaxial growth process. Again, the photo resist layer 175 that protects the region of the first transistor 115 is thereafter removed by, for instance, ashing or the like as well understood by those skilled in the art.

Figure 12:
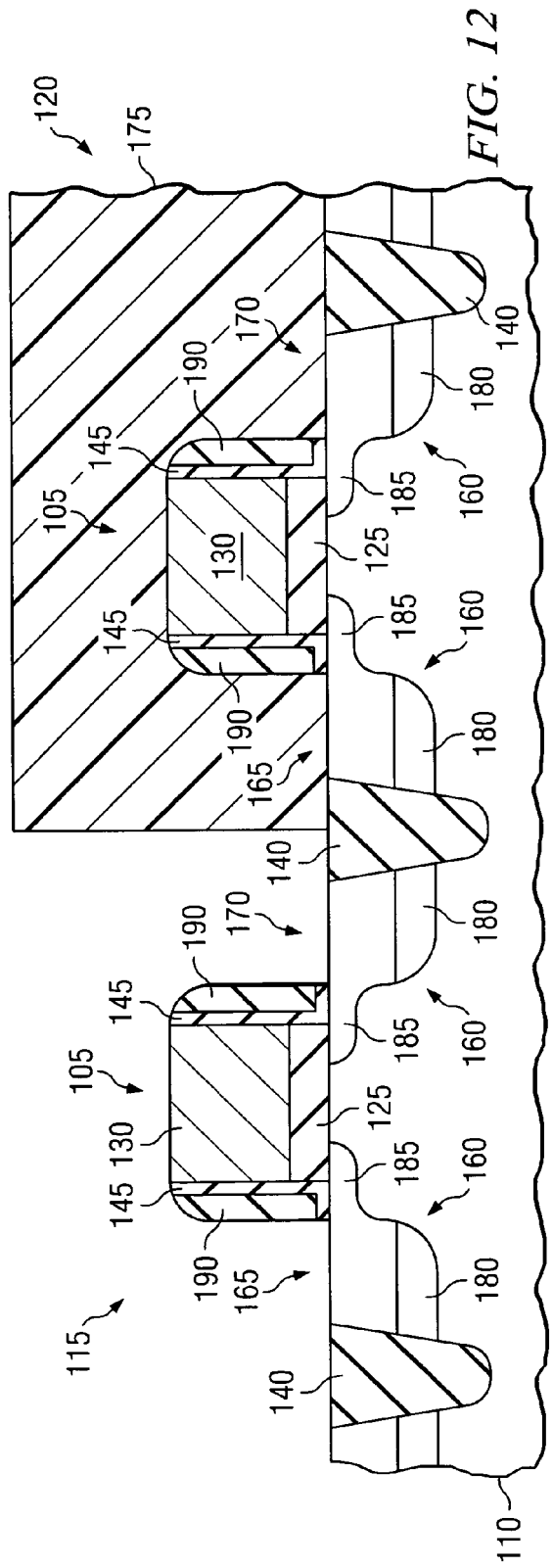

Turning now to FIG. 12, the region of the second transistor 120 is then protected by a photo resist layer 175 and an ion implantation process is performed to dope the epitaxial grown source 165 and drain 170 of the first transistor 115. Typically, to dope the source 165 and drain 170 of the first transistor 115 (a P-type metal oxide semiconductor), boron ions are implanted into the substrate 110 and the gate 105 and spacers 190 serve as a mask. Of course, other P-type dopants such as boron difluoride may also be introduced to dope the source 165 and drain 170 of the first transistor 115. The ion implantation process of boron may be performed at an energy level of about 1 to 20 keV and at a dose of $5\times10^{12}$ to $5\times10^{15}$ atoms/cm$^2$. Again, while an ion implantation process has been described to dope the epitaxial gown source 165 and drain 170, those skilled in the art will recognize that other processes such as an in situ doped epitaxial growth process may be employed to introduce P-type dopants into the source 165 and drain 170 of the first transistor 115 during the epitaxial growth process. Again, the photo resist layer 175 that protects the region of the second transistor 120 is thereafter removed by, for instance, ashing or the like as well understood by those skilled in the art.

Figure 13:
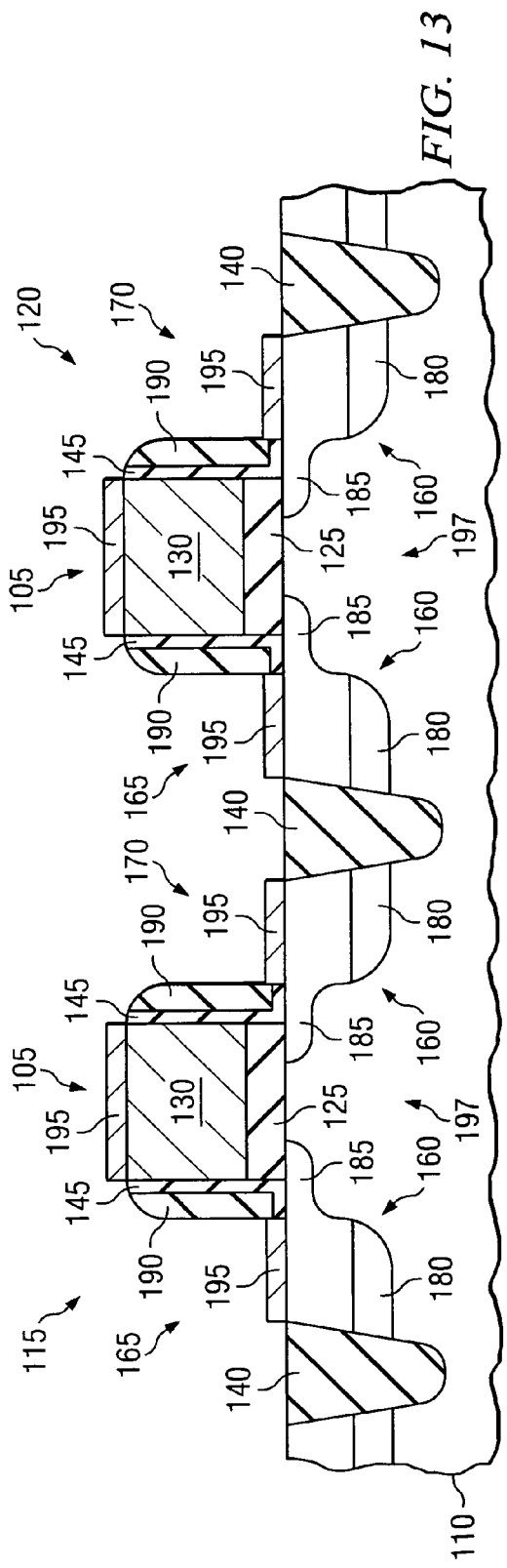

Turning now to FIG. 13, a salicide process is hereinafter performed to create enhanced contacts 195 for the gate 105, source 165 and drain 170 of the first and second transistors 115, 120. The salicide processing involves deposition of a metal that forms an intermetallic compound with silicon, but does not react with silicon oxides, nitrides, or oxynitrides under normal processing conditions. Metals commonly employed in salicide processing include platinum, titanium, nickel, tungsten and cobalt, each of which forms very low resistivity phases with silicon. The metal is deposited in a substantially uniform thickness over all exposed surface features of the substrate 110 and the first and second transistors 115, 120, preferably by a physical vapor deposition process (e.g., sputtering from an ultra pure target utilizing an ultra-high vacuum, multi-chamber DC magnetron sputtering system).

After deposition, the metal layer blankets a top surface of the gate electrode 130, the spacers 190 about the gate 105, the doped regions of the source 165 and drain 170, and the shallow trench isolation regions 140. As a result of thermal processing (e.g., a rapid thermal annealing process), the metal layer reacts with underlying silicon to form electrically conductive metal silicide layers on a top surface of the gate 105, source 165 and drain 170 of the first and second transistors 115, 120. Unreacted portions of the metal layer (e.g., the spacers 190 about the gate 105 and the shallow trench isolation regions 140) are then removed employing, for instance, a wet chemical etching process selective to the metal silicide layers. The metal silicide layers form enhanced contacts 195 for the gate 105, source 165 and drain 170 of the first and second transistors 115, 120.

Thus, the aforementioned processes provide first and second transistors 115, 120 with enhanced characteristics. For instance, an implant energy of deep doped region 180 is pretty low so that the dopants will not implant through the gate electrode 130 and will not damage the gate dielectric 125. Also, a lateral diffusion of deep doped region 180 will not impact a channel region 197 underlying the gate 105 so that short channel effect can be well controlled by the lightly doped drain regions 185.

Additionally, the first and second transistors 115, 120 exhibit a reduced junction capacitance in accordance with forming the source 165 and drain 170 over multiple processes and, especially, in view of the deep doped regions 180 thereof. For instance, the reduced junction capacitance is a function of the graded characteristic of the source 165 and drain 170 in accordance with the lightly doped drain regions 185 through the deep doped regions 180. Looking at the first transistor 115 (a P-type metal oxide semiconductor) as an example, the multiple boron ion implants associated with the first transistor 115 suppress a junction profile of the doped ions in the substrate 110. Consequently, a junction capacitance of the first transistor 115 is reduced and an operational switching period thereof can be upgraded. Of course, an analogous benefit is achieved via the construction of and provided by the second transistor 120 as well.

Turning now to FIGS. 14-25, illustrated are cross sectional views of another embodiment of constructing a transistor according to the principles of the present invention. Inasmuch as many of the processes to construct and characteristics of the transistors illustrated in FIGS. 14-25 are analogous to the processes to construct and characteristics of the transistors described with respect to FIGS. 1-13, many of the details regarding the construction thereof will hereinafter be omitted. It is contemplated that higher temperatures (e.g., equal to or greater than 650 degrees Celsius) are employed for the selective epitaxial growth process for the transistors described with respect to FIGS. 1-13. An advantage of using the lower temperatures is that dopant diffusion caused from thermal processes may be avoided. Conversely, the processes to construct the transistors illustrated in FIGS. 14-25 generally employ lower temperatures (e.g., 300 to 650 degrees Celsius) for the selective epitaxial growth process.

Beginning with FIG. 14, a gate 205 (e.g., a polysilicon gate) is formed over a substrate 210 (e.g., a silicon substrate) employing conventional semiconductor processes. In the present embodiment, a process of constructing a first transistor 215 (e.g., a P-type metal oxide semiconductor) and a second transistor 220 (e.g., a N-type metal oxide semiconductor) are illustrated and described. In the interim processing step illustrated in FIG. 14, the first transistor 215 includes a gate 205 having a gate dielectric 225, a gate electrode 230, and a hard mask 235 on a top surface thereof. Similarly, the second transistor 220 includes a gate 205 having a gate dielectric 225, a gate electrode 230, and a hard mask 235 on a top surface thereof. The substrate 210 includes shallow trench isolation regions 240 formed by conventional methods.

Turning now to FIG. 15, the first and second transistors 215, 220 are placed in an oxidizing environment and exposed regions of silicon including the substrate 210 and polysilicon layers of the gates 205 are oxidized or deposited to form an oxide layer 245 about the first and second transistors 215, 220. The shallow trench regions 240 and the hard mask 235 (if formed by an oxide material) may also have an oxide layer formed on exposed surfaces thereof. For purposes of clarity, however, an oxide layer is not illustrated on the shallow trench regions 240 and the hard mask 235 of the first and second transistors 215, 220.

A region of the first transistor 215 is then protected by a photo resist layer 250 and an ion implantation process is performed to form a lightly doped drain region 255 adjacent and slightly under the gate 205 of the second transistor 220. Typically, to form the lightly doped drain regions 255 of the second transistor 220 (a N-type metal oxide semiconductor), arsenic ions are implanted into the substrate 210 and the gate 205 serves as a mask. As illustrated, the lightly doped drain regions 255 are not spaced apart from, but in fact align with, the edges of the gate 205. In fact, the lightly doped drain regions 255 underlie a portion of the gate 205, which provides a shorter effective channel length under the gate 205 of the second transistor 220. The photo resist layer 250 that protects the region of the first transistor 215 is thereafter removed as well understood by those skilled in the art.

Turning now to FIG. 16, a region of the second transistor 220 is then protected by a photo resist layer 250 and an ion implantation process is performed to form a lightly doped drain region 255 adjacent and slightly under the gate 205 of the first transistor 215. Typically, to form the lightly doped drain regions 255 of the first transistor 215 (a P-type metal oxide semiconductor), boron ions are implanted into the substrate 210 and the gate 205 serves as a mask. Analogous to discussion above, the lightly doped drain regions 255 underlie a portion of the gate 205 of the first transistor 215, which provides a shorter effective channel length under the gate 205 of the first transistor 215. Again, the photo resist layer 250 that protects the region of the second transistor 220 is thereafter removed as well understood by those skilled in the art.

Turning now to FIGS. 17 and 18, an insulating layer 260 (e.g., a silicon nitride, silicon oxide or a combination thereof) is blanket deposited over the substrate 210 and first and second transistors 215, 220 using, for instance, a chemical vapor deposition or a plasma enhanced chemical vapor deposition. Thereafter, spacers 265 are formed about the gates 205 of the first and second transistors 215, 220 by plasma dry etching the insulating layer until the planar portions of the substrate 210 and hard mask 235 of the gates 205 of the first and second transistors 215, 220 are reached (see FIG. 18).

Turning now to FIG. 19, recesses 270 in which will be formed a source 275 and drain 280 of the first and second transistors 215, 220 are formed by etching the substrate 210 adjacent the gates 205 thereof. The recesses 270 are self aligned with the spacers 265 about the gates 205 of the first and second transistors 215, 220. As illustrated, the lightly doped drain regions 255 underlying the spacers 265 about the gates 205 of the first and second transistors 215, 220 are not etched away and remain intact.

Figure 20:
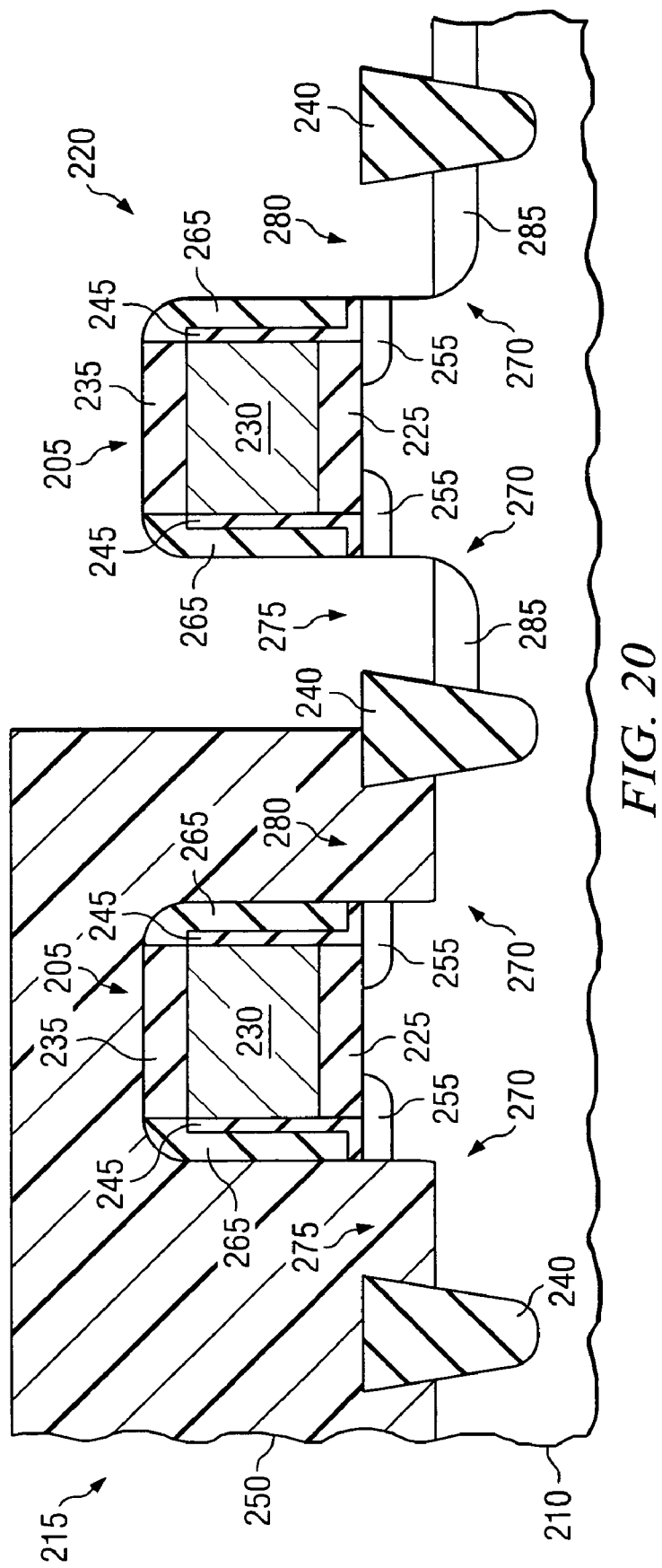

Turning now to FIG. 20, the region of the first transistor 215 is protected by a photo resist layer 250 and an ion implantation process is performed to form a deep doped region 285 below a bottom surface of the recesses 270 for the source 275 and drain 280 of the second transistor 220. Typically, to form the deep doped regions 285 in the second transistor 220 (a N-type metal oxide semiconductor), arsenic ions are implanted into the substrate 210 and the gate 205 and spacers 265 serve as a mask. Again, the photo resist layer 250 that protects the region of the first transistor 215 is thereafter removed as well understood by those skilled in the art.

Figure 21:
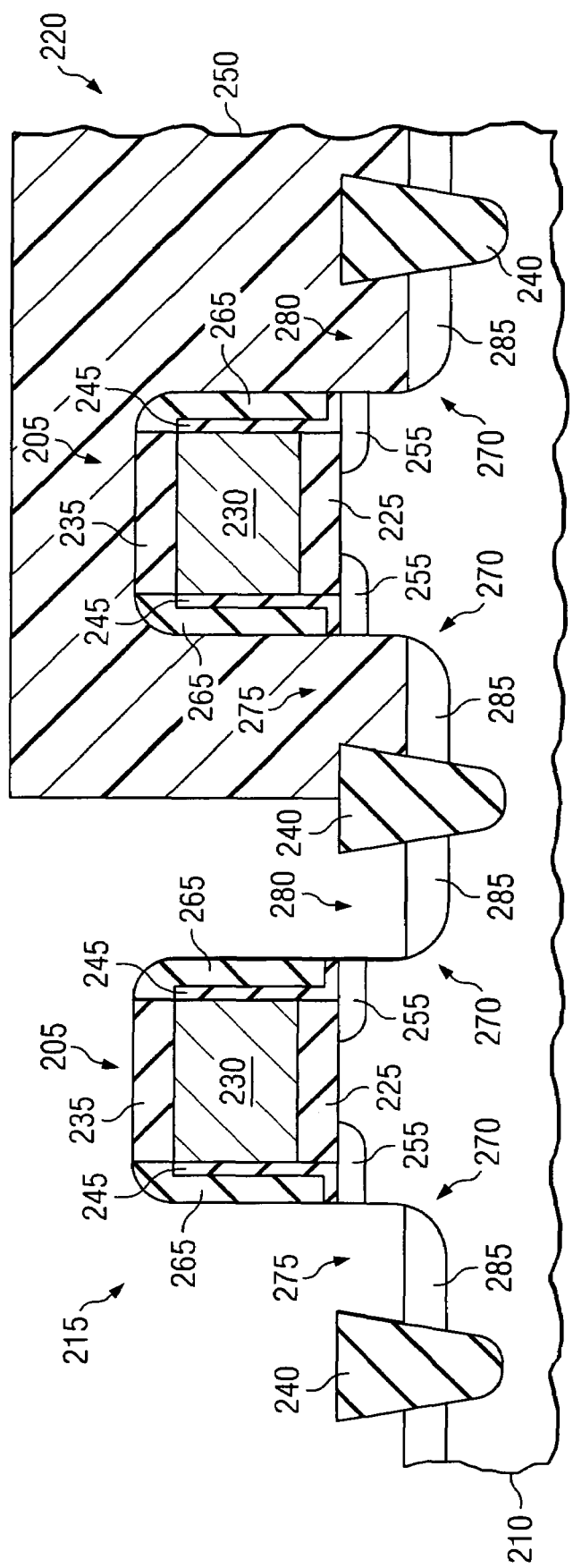

Turning now to FIG. 21, the region of the second transistor 220 is then protected by a photo resist layer 250 and an ion implantation process is performed to form a deep doped region 285 below a bottom surface of the recesses 270 for the source 275 and drain 280 of the first transistor 215. Typically, to form the deep doped regions 285 in the first transistor 215 (a P-type metal oxide semiconductor), boron ions are implanted into the substrate 210 and the gate 205 and spacers 265 serve as a mask. Again, the photo resist layer 250 that protects region of the second transistor 220 is thereafter removed as well understood by those skilled in the art.

Turning now to FIG. 22, a selective epitaxial growth process is performed to deposit, for instance, silicon, silicon germanium or silicon carbon within the recesses 270 for the source 275 and drain 280 of the first and second transistors 215, 220. Thereafter, the hard mask 235 about the gates 205 of the first and second transistors 215, 220 are removed.

Turning now to FIG. 23, the region of the first transistor 215 is then protected by a photo resist layer 250 and an ion implantation process is performed to dope the epitaxial grown source 275 and drain 280 of the second transistor 220. Typically, to dope the source 275 and drain 280 of the second transistor 220 (a N-type metal oxide semiconductor), arsenic ions are implanted into the substrate 210 and the gate 205 and spacers 265 serve as a mask. Again, the photo resist layer 250 that protects the region of the first transistor 215 is thereafter removed as well understood by those skilled in the art.

Turning now to FIG. 24, the region of the second transistor 220 is then protected by a photo resist layer 250 and an ion implantation process is performed to dope the epitaxial grown source 275 and drain 280 of the first transistor 215. Typically, to dope the source 275 and drain 280 of the first transistor 215 (a P-type metal oxide semiconductor), boron ions are implanted into the substrate 210 and the gate 205 and spacers 265 serve as a mask. Again, the photo resist layer 250 that protects the region of the second transistor 220 is thereafter removed as well understood by those skilled in the art.

Turning now to FIG. 25, a salicide process is hereinafter performed to create enhanced contacts 290 for the gate 205, source 275 and drain 280 of the first and second transistors 215, 220. A metal is deposited in a substantially uniform thickness over all exposed surface features of the substrate 210 and the first and second transistors 215, 220. As a result of thermal processing, the metal layer reacts with underlying silicon to form electrically conductive metal silicide layers on a top surface of the gate 205, source 275 and drain 280 of the first and second transistors 215, 220. Unreacted portions of the metal layer (e.g., the spacers 265 about the gate 205 and the shallow trench isolation regions 240) are then removed. The metal silicide layers form enhanced contacts 290 for the gate 205, source 275 and drain 280 of the first and second transistors 215, 220. As mentioned above, the first and second transistors 215, 220 exhibit a reduced junction capacitance in accordance with forming the source and drain 275, 280 over multiple processes and, especially, in view of the deep doped regions 285 thereof.

Thus, a method of forming a source/drain, a method of forming a transistor and a transistor with readily attainable and quantifiable advantages has been introduced. Those skilled in the art should understand that the previously described embodiments of the transistor and related method of forming the transistor are submitted for illustrative purposes only and that other embodiments capable of providing a deep doped region in a semiconductor device are well within the broad scope of the present invention.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor comprising:
    a gate formed on a substrate; and
    a source/drain formed in a recess of said substrate adjacent said gate and including:
        a lightly doped drain region adjacent said gate;
        a heavily doped region in said recess adjacent the lightly doped drain region; and
        a conductive deep doped region below a bottom surface of said recess.

2. The transistor as recited in claim 1 further comprising another source/drain formed in another recess of said substrate adjacent said gate and including:
    a lightly doped drain region adjacent said gate; and
    a deep doped region below a bottom surface of said another recess.

3. The transistor as recited in claim 1 wherein said source/drain comprises an epitaxially grown semiconductor material.

4. The transistor as recited in claim 1 further comprising spacers on opposing walls of said gate.

5. The transistor as recited in claim 1 wherein said gate and source/drain comprise a contact.

6. A transistor comprising:
    a gate formed on a substrate;
    a source formed in a recess of said substrate adjacent said gate and including:
        a first lightly doped source region adjacent said gate;
        a first heavily doped source region adjacent the first lightly doped source region; and
        a first conductive deep doped region below a bottom surface of said recess and the first heavily doped source region; and
    a drain formed in a recess of said substrate adjacent said gate on an opposing side from said source and including:
        a first lightly doped drain region adjacent said gate;
        a first heavily doped drain region adjacent the first lightly doped drain region; and
        a second conductive deep doped region below a bottom surface of said recess and the first heavily doped drain region.

7. The transistor as recited in claim 6 wherein said source comprises an epitaxially grown semiconductor material.

8. The transistor as recited in claim 6 wherein said drain comprises an epitaxially grown semiconductor material.

9. The transistor as recited in claim 6 wherein said gate comprises a gate dielectric and a gate electrode.

10. The transistor as recited in claim 6 wherein a shallow trench isolation region is located in said substrate.

11. The transistor as recited in claim 6 wherein said gate comprises a gate dielectric composed of an oxide layer.

12. The transistor as recited in claim 6 wherein said gate comprises a gate electrode composed of a polysilicon layer.

13. The transistor as recited in claim 6 wherein a depth of said recesses for said source and drain is a function of a desired characteristic of said transistor.

14. The transistor as recited in claim 6 wherein said first and second lightly doped drain regions for said source and said drain underlie a portion of said gate within said substrate.

15. The transistor as recited in claim 6 further comprising spacers on opposing walls of said gate.

16. The transistor as recited in claim 6 wherein said gate, source and drain comprise enhanced contacts.

17. The transistor as recited in claim 6 further comprising a channel region underlying said gate within said substrate.

18. The transistor as recited in claim 6 wherein said first lightly doped source region and first lightly doped drain region and said first and second conductive deep doped regions of said source and said drain contribute to a graded characteristic thereof.

19. The transistor as recited in claim 6 wherein said recess for said source and said recess for said drain are substantially symmetrical about said gate within said substrate.

20. The transistor as recited in claim 6 wherein said first lightly doped source region and first lightly doped drain region for said source and said drain are doped at a dose in a range of $5 \times 10^{14}$ to $2 \times 10^{15}$ atoms/cm$^2$ and said first and second conductive deep doped regions for said source and said drain are doped at a dose of about $5 \times 10^{12}$ to $2 \times 10^{14}$ atoms/cm$^2$.

* * * * *

UNITED STATES PATENT AND TRADEMARK OFFICE
CERTIFICATE OF CORRECTION

PATENT NO. : 7,315,051 B2
APPLICATION NO. : 11/059956
DATED : January 1, 2008
INVENTOR(S) : Cheng It is certified that error appears in the above-identified patent and that said Letters Patent is hereby corrected as shown below:

In Col. 4, line 31, delete "(run)" and insert --(nm)--.
In Col. 7, line 21, delete "in situ" and insert --*in situ*--.
In Col. 7, line 45, delete "in situ" and insert --*in situ*--.
In Col. 8, line 21, delete "130" insert --130--.
In Col. 12, line 59, claim 20, delete "$2\times 10^{14}$" and insert --$1\times 10^{14}$--.

Signed and Sealed this

Tenth Day of June, 2008

JON W. DUDAS
*Director of the United States Patent and Trademark Office*